United States Patent
Li et al.

(10) Patent No.: US 8,769,472 B1
(45) Date of Patent: Jul. 1, 2014

(54) COMPUTING DEVICE AND METHOD FOR CHECKING SIGNAL TRANSMISSION LINE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Yan-Jun Li, Shenzhen (CN); Ya-Ling Huang, Shenzhen (CN); Chia-Nan Pai, New Taipei (TW); Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/873,157

(22) Filed: Apr. 29, 2013

(30) Foreign Application Priority Data

Dec. 10, 2012   (CN) .................. 2012 1 05255900

(51) Int. Cl.
*G06F 17/50* (2006.01)
(52) U.S. Cl.
USPC .......................................... 716/137

(58) Field of Classification Search
USPC ................................. 716/100, 137
See application file for complete search history.

(56) References Cited

U.S. PATENT DOCUMENTS

| | | | |
|---|---|---|---|
| 2002/0019970 A1* | 2/2002 | Araki et al. ............... | 716/13 |
| 2008/0109773 A1* | 5/2008 | Douriet ..................... | 716/5 |
| 2011/0061039 A1* | 3/2011 | Kumagai et al. ......... | 716/126 |
| 2012/0079443 A1* | 3/2012 | Nagase et al. ............ | 716/112 |
| 2012/0185819 A1* | 7/2012 | Shan et al. ............... | 716/136 |
| 2013/0125084 A1* | 5/2013 | Nishio et al. ............. | 716/137 |

* cited by examiner

*Primary Examiner* — Suchin Parihar
(74) *Attorney, Agent, or Firm* — Novak Druce Connolly Bove + Quigg LLP

(57) ABSTRACT

A signal transmission line check method to be executed by a computing device is described. A to-be-checked signal transmission line group in a displayed printed circuit board (PCB) layout is determined. Whether all signal transmission lines of the to-be-checked signal transmission line group are laid out in a same layer of the displayed PCB layout is checked according to an input serial number of a chipset and layer properties of the to-be-checked signal transmission lines. The signal transmission lines that do not satisfy design standards are determined when not all of the to-be-checked signal transmission lines are laid out in a same layer. A related computing device is also disclosed.

4 Claims, 5 Drawing Sheets

| Signal transmission line group selection | Chipset | | | |
|---|---|---|---|---|
| Group name:<br>FLASH_B4_IO<br>FLASH_B7_IO | Signal transmission lines which do not satisfy design standards: | | | |
| | Net_Name | Cline_Layer | Location | Bus_Layer |
| | FLASH_Q1_WEN0 | SIG3 | (1045.0 725.0) | SIG6 |
| | | | | |

Check

FIG. 3

COMPUTING DEVICE AND METHOD FOR CHECKING SIGNAL TRANSMISSION LINE

BACKGROUND

1. Technical Field

Embodiments of the present disclosure relates to circuit simulation systems and methods, and particularly, to a computing device and a method for checking whether signals transmission lines of a group are laid out in the same layer in a printed circuit board (PCB) layout.

2. Description of Related Art

In designing a PCB layout, signal transmission lines of a group should be laid out in a same layer. Generally, checking whether all signal transmission lines of a group are laid out in a same layer of a displayed PCB layout is often visually done by a technician, which is time-consuming and error-prone.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

FIGS. 3-4 are schematic views to show user interfaces provided by the signal transmission line check system of FIG. 2.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
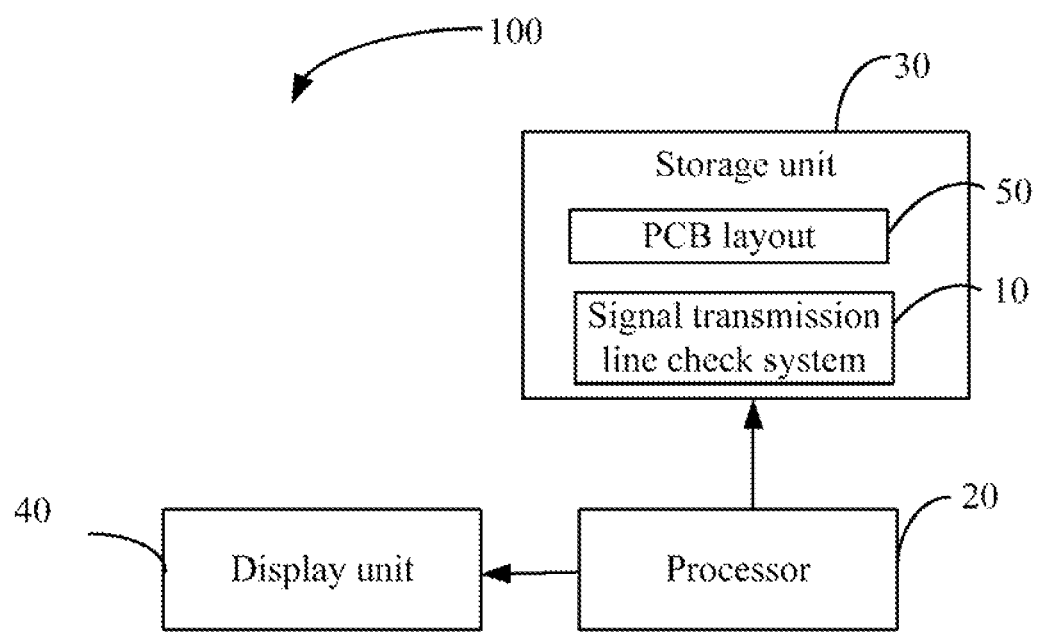
FIG. 1 is a block diagram of one embodiment of a computing device executing a signal transmission line check system.

FIG. 1 shows a block diagram of one embodiment of a computing device 100. The computing device 100 includes a processor 20, a storage unit 30, and a display unit 40. The storage unit 30 may be a computer, a smart media card, a secure digital card, or a flash card. The storage unit 30 stores computerized codes of a signal transmission line check system 10 and at least one PCB layout 50. The signal transmission line check system 10 includes various software components and/or a set of instructions, which may be implemented by the processor 20 to automatically check whether all signal transmission line of a group are laid out in a same layer and automatically mark the signal transmission lines that do not satisfy design standards.

Figure 2:
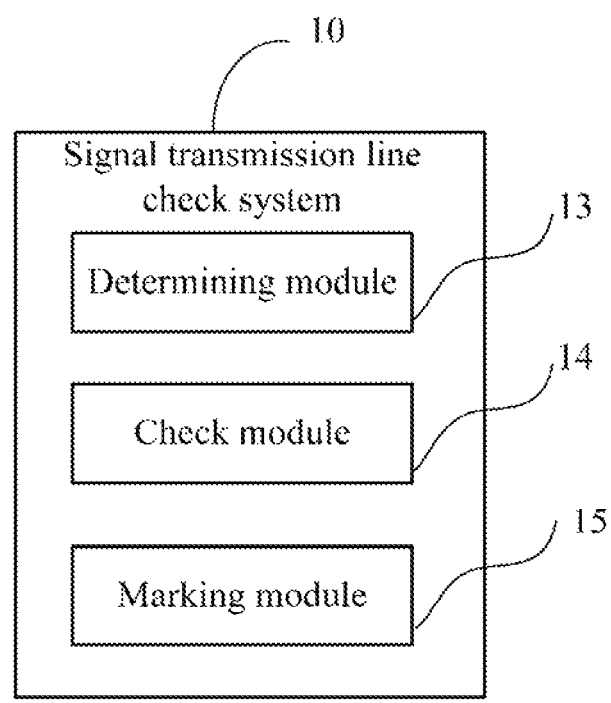
FIG. 2 is a block diagram of one embodiment of function modules of the signal transmission line check system.

FIG. 2 shows a block diagram of the function modules of the signal transmission line check system 10 in the computing device 100 of FIG. 1. In one embodiment, the signal transmission line check system 10 includes a determining module 13, a check module 14, and a marking module 15.

The determining module 13 includes various software components and/or set of instructions, which may be implemented by the processor 20 to determine a to-be-checked signal transmission line group in a PCB layout displayed on the display unit 40.

The check module 14 includes various software components and/or a set of instructions, which may be implemented by the processor 20 to check whether all signal transmission lines of the to-be-checked signal transmission line group are laid out in a same layer of the displayed PCB layout according to an input serial number of a chipset and layer properties of the to-be-checked signal transmission lines, and determine the signal transmission lines which do not satisfy design standards when not all of the to-be-checked signal transmission lines are laid out in a same layer.

The marking module 15 includes various software components and/or a set of instructions, which may be implemented by the processor 20 to mark the signal transmission lines that do not satisfy design standards in the displayed PCB layout.

Figure 4:
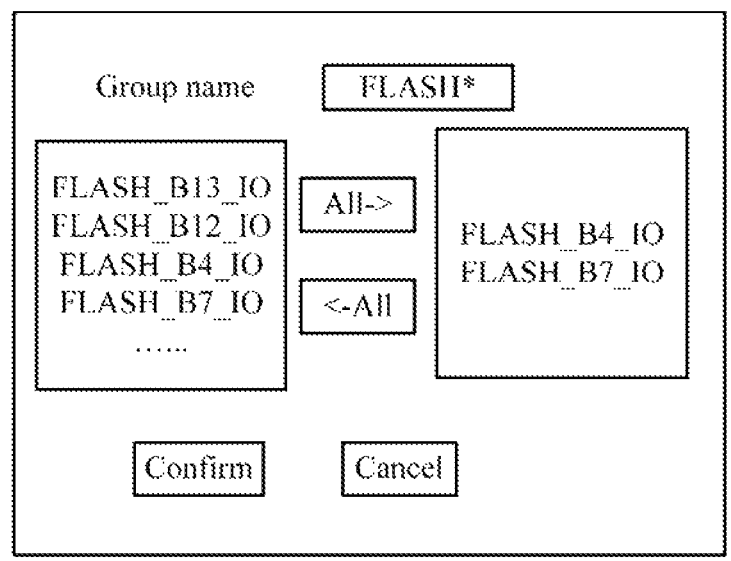

Referring to FIG. 3, a user interface provided by the signal line transmission check system 10 includes a signal transmission line group selection button, a chipset number input box, and a number of display windows, for example, a name display window, and an information display window to show information of signal transmission lines which do not satisfy design standards. When the signal transmission line group selection button is clicked, a search interface (see FIG. 4) for searching to-be-checked signal transmission line groups are displayed. The chipset number input box is for users to input a serial number of a transmitter connected to to-be-checked signal transmission lines. The name display window first display names of to-be-checked signal transmission line groups. After finishing check, the name display window displays names of the signal transmission lines that do not satisfy design standards. When one signal transmission line name is clicked, information of the signal transmission line is displayed in the information display window. The search interface includes a group name input box, a search result display window, and a selection result display window. The signal transmission line check system 10 searches signal transmission line groups according to the input group names, and display the found signal transmission line groups in the search result display window. When one signal transmission line group in the search result display window is clicked, the selected signal transmission line group is displayed in the selection result display window and can be taken as a to-be-checked signal transmission line group.

Figure 5:
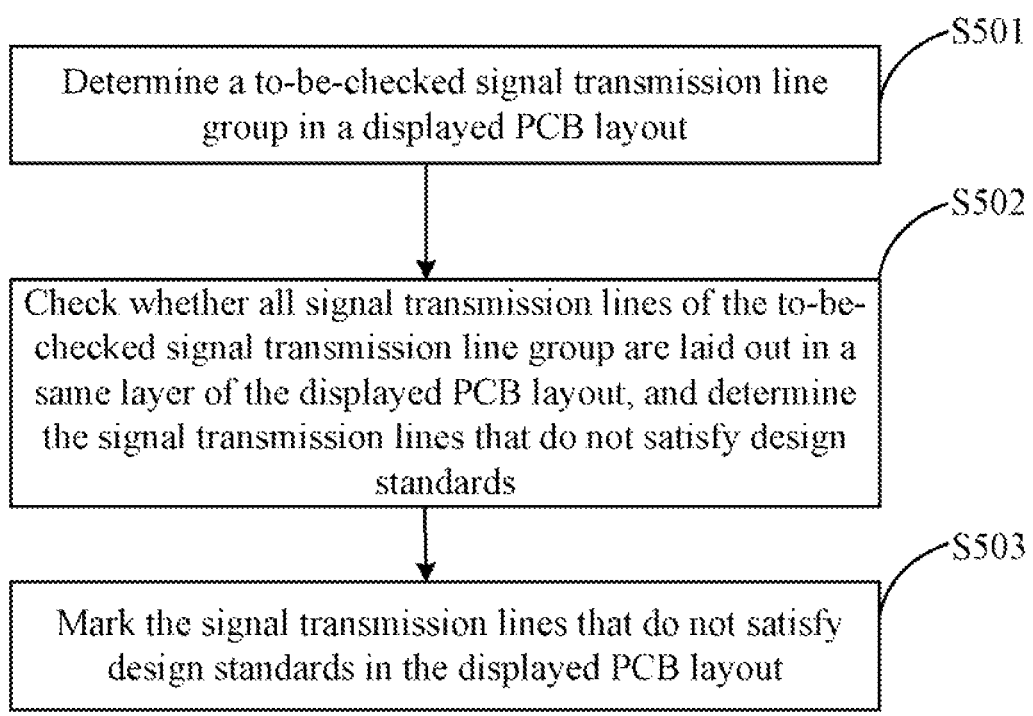
FIG. 5 is a flowchart of one embodiment of a signal transmission line check method.

FIG. 5 is a flowchart of one embodiment of a signal transmission line check method. Depending on the embodiment, additional blocks may be added, others removed, and the ordering of the blocks may be changed.

In block S501, the determining module 13 determines a to-be-checked signal transmission line group in a PCB layout displayed on the display unit 40.

In block S502, the check module 13 checks whether all signal transmission lines of the to-be-checked signal transmission line group are laid out in a same layer of the displayed PCB layout according to an input serial number of a chipset and layer properties of the to-be-checked signal transmission lines, and determines the signal transmission lines which do not satisfy design standards when not all of the to-be-checked signal transmission lines are laid out in a same layer.

In block S503, the marking module 15 marks the signal transmission lines that do not satisfy design standards in the displayed PCB layout.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A signal transmission line check method to be executed by a computing device, the method comprising:
   determining a to-be-checked signal transmission line group in a displayed printed circuit board (PCB) layout;
   checking whether all signal transmission lines of the to-be-checked signal transmission line group are laid out in a same layer of the displayed PCB layout according to an input serial number of a chipset and layer properties of the to-be-checked signal transmission lines; and
   determining the signal transmission lines that do not satisfy design standards when not all of the to-be-checked signal transmission lines are laid out in a same layer.

2. The signal transmission line check method as described in claim 1, further comprising:
   marking the signal transmission lines that do not satisfy design standards in the displayed PCB layout.

3. A computing device for checking signal transmission lines, comprising:
   a storage device;
   at least one processor; and
   a signal transmission line check system comprising computerized code in the form of one or more programs, which are stored in the storage device and executable by the at least one processor, the one or more programs comprising:
   a determining module operable to determine a to-be-checked signal transmission line group in a displayed printed circuit board (PCB) layout; and
   a check module operable to check whether all signal transmission lines of the to-be-checked signal transmission line group are laid out in a same layer of the displayed PCB layout according to an input serial number of a chipset and layer properties of the to-be-checked signal transmission lines, and determine the signal transmission lines that do not satisfy design standards when not all of the to-be-checked signal transmission lines are laid out in a same layer.

4. The computing device as claimed in claim 3, wherein the one or more programs further comprises a marking module operable to mark the signal transmission lines that do not satisfy design standards in the displayed PCB layout.

* * * * *